United States Patent
Itabashi et al.

(10) Patent No.: US 6,300,244 B1
(45) Date of Patent: Oct. 9, 2001

(54) SEMICONDUCTOR DEVICE AND METHOD OF MANUFACTURING THE SAME

(75) Inventors: Takeyuki Itabashi; Toshio Haba; Haruo Akahoshi, all of Hitachi (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/317,955

(22) Filed: May 25, 1999

(30) Foreign Application Priority Data

May 25, 1998 (JP) .................................. 10-143133

(51) Int. Cl.⁷ ...................... H01L 21/24; H01L 21/4763; B01D 57/02; C25D 5/02; B05D 5/12
(52) U.S. Cl. .................. 438/678; 438/622; 438/629; 438/688; 438/687; 204/450; 204/489; 205/123; 205/126; 427/98
(58) Field of Search ...................... 438/678, 403, 438/688, 687, 675, 622, 625, 627, 629; 427/97, 98, 443.1, 437, 304, 305; 204/471, 489, 492, 498, 499, 450; 205/123, 125, 126

(56) References Cited

U.S. PATENT DOCUMENTS

| 4,985,750 | 1/1991 | Hoshino | 23/48 |
|---|---|---|---|
| 5,384,284 | 1/1995 | Doan et al. | 437/190 |
| 5,660,706 * | 8/1997 | Zhao et al. | 205/123 |
| 5,674,787 | 10/1997 | Zhao et al. | 437/230 |
| 5,723,387 | 3/1998 | Chen | 438/692 |
| 5,891,513 * | 4/1999 | Dubin et al. | 427/98 |
| 6,093,647 * | 6/2000 | Yu et al. | 438/687 |

FOREIGN PATENT DOCUMENTS

| 692554 | 1/1996 | (EP) . |
|---|---|---|
| 8-83796 | 3/1996 | (JP) . |
| 9-316651 | 12/1997 | (JP) . |

OTHER PUBLICATIONS

Shacham–Diamand et al, "High aspect ratio quarter–micron electroless copper integrated technology", Marerials for Advances Metallization, MAM 1997, pp. 11–14.*

* cited by examiner

Primary Examiner—Charles Bowers
Assistant Examiner—Thanhha Pham
(74) Attorney, Agent, or Firm—Antonelli, Terry, Stout & Kraus, LLP (57) ABSTRACT

When a wiring conductor is formed on a semiconductor substrate, a via-hole or a trench is formed by directly performing electroless plating on a barrier layer containing a very small depressed portion such as the via-hole or the trench in an insulator layer without using a dry metallized method or a substitutive plating method.

The semiconductor device is provided with an insulator layer having a via-stud on a semiconductor substrate, the via-stud being formed in a via-hole through a barrier layer formed of an inorganic compound layer or a high melting point metal layer formed on an inner surface of the via-hole, the via-stud being made of the same metal as a metal composing the barrier layer. The semiconductor device can be obtained by forming the barrier layer on the inner surface of the via-hole in the semiconductor substrate, then treating the substrate with a treatment solution containing a complex forming agent, immersing the treated substrate into an electroless plating solution, bringing a member made of the same metal as a metal formed by the electroless plating in contact with the electroless plating solution, and electrically connecting the member to the barrier layer to perform electroless plating.

18 Claims, 8 Drawing Sheets

SEMICONDUCTOR DEVICE AND METHOD OF MANUFACTURING THE SAME

BACKGROUND OF THE INVENTION

The present invention relates to a novel plating method to be and particularly to a plating method used for forming wiring on a substrate in a semiconductor device, such as an LSI or the like.

Both an aluminum sputtering method and a tungsten CVD method have been used for depositing a metal film to be used as wiring in a semiconductor device. However, the wiring is expected to be made finer as a result of continuing progress in achieving higher integration of LSI devices, and, consequently, there arise problems caused by delay in signal transfer speed due to high resistivity and a decrease in reliability due to low migration resistance when a wiring material such as aluminum, tungsten or the like is used. Although copper is expected to be used as a wiring material in place of the conventional material because it is capable of realizing low resistivity and high electro-migration resistance, there are many problems to be solved if this wiring material is to be used.

In a case of using copper as the wiring material, it is generally difficult to use a dry etching method, which is used to form aluminum wiring, as the wiring forming method. Therefore, a method is employed in which an insulation film is formed on a substrate in advance, portions of the insulation film corresponding to locations of the wiring or interlayer connecting conductive bodies are machined to produce a depressed shape, and then the depressed portions are filled with copper.

As a filling method, there is a method of selectively filling only the depressed portion, but a more common method is one in which the whole surface of the substrate, including the depressed portions, is metallized, and then chemical-mechanical polishing (CMP polishing) is performed on the surface to remove the surface layer. As the metallizing method for filling a depressed portions, there are dry metallizing methods, such as a sputtering method, a chemical vapor deposition method (CVD method) and the like, and wet metallizing methods, such as electroless plating, electrolytic plating and the like.

In recent years, much attention has been focused on a process combining the wet metallizing method and the CMP polishing, because the wet metallizing method is advantageous in that it has a good filling capability with respect to very small depressed portions for forming high density wiring. Japanese Patent Application Laid-Open No.8-83796 discloses a method of filling wiring trenches through electroless plating using silver, copper, gold, nickel, cobalt or palladium.

In order to achieve a reduction in the resistivity of wiring to a value lower than that of aluminum wiring, it is considered that only silver, copper and gold may be used. In a case of using such a metal, a palladium seed layer is formed by collimator sputtering, and then an electroless plating film is formed on the palladium seed layer. In such a method, the process of forming the palladium seed layer by collimator sputtering becomes a bottleneck, and, accordingly, it is impossible with this procedure to make the wiring sufficiently fine. In addition, palladium will easily react with the electroless metal to easily penetrate into the wiring metal, which causes an increase in the resistivity. This result is inconsistent with the objective of employing a low resistive metal for replacing aluminum.

Further, Japanese Patent Application Laid-Open No.6-29246 discloses a method in which a substance serving as a catalyst for electroless plating reaction is added to the inside of trenches and holes through wet treatment, and then the inside of the holes are filled with a metal by electroless plating. In this case, palladium is used for the catalyst. For purposes of reducing the resistivity of wiring to a value lower than that of aluminum wiring, electroless plating of copper is the best method. However, palladium easily reacts with copper to increase the resistivity, and consequently the essential object of reducing the resistivity can not be attained with this procedure.

Further, there is a well known method in which a zinc oxide layer is formed in a silicon oxide film (an insulator film) having very small depressed portions formed through spray pyrolysis, and palladium or the like is substitutively plated while the zinc oxide layer is being melted, and then a copper or gold film is formed by electrolytic plating or electroless plating using the palladium as a seed layer. However, since palladium is used in this method, similar to in the above-mentioned method, there is a problem in that the resistivity of the wiring metal is increased. In addition to this, there is a possibility that the mixing of zinc deteriorates the characteristic of the element.

Furthermore, Japanese Patent Application Laid-Open No.7-283219, Japanese Patent Application Laid-Open No.7-122556 and Japanese Patent Application Laid-Open No.8-83796 disclose methods in which a titanium film, a titanium nitride film and a tantalum film are successively formed on a surface of an insulator layer having depressed portions formed thereon, and then copper is electrolytically plated on the films to form wiring. In this case, in contrast to the aforementioned methods, it seems that no increase in resistivity of the copper wiring by a different kind of element, such as palladium, is caused. However, because the electric resistivity of the multilayer thin film of titanium, titanium nitride and tantalum is large, the method has a disadvantage in that the capability of filling the depressed portions is poor when the multilayer thin film is used as a cathode for electrolytic plating.

In electrolytic plating, the application of a uniform electric field is required in order to obtain a uniform deposition. However, in a case of a cathode having a high resistivity, as described above, it is difficult to apply the electric field to a portion near the bottom of the depressed portion. Particularly, it is anticipated that the filling capability is deteriorated as the depressed portion is narrowed and deepened (the aspect ratio is increased). This is a fatal weakness of this method for forming fine wiring.

Although various methods of filling depressed portions with a metal through use of a wet metallizing method, which is advantageous in filling very small depressed portions, have been studied, as described above, each of the methods has problems. Since the object is to reduce the resistivity of wiring to a value lower than that of aluminum wiring, alternative metallic materials are limited to copper, silver and gold.

However, since these metals likely react with a insulator layer or silicon, four surfaces of the metal wiring need to be protected by a barrier layer made of an electric conductor. Materials capable of functioning as a metallic barrier layer, are metal nitrides such as titanium nitride, tungsten nitride, tantalum nitride and so on, high melting point metals, such as tantalum, tungsten and so on, and alloys of the high melting point metals.

However, since the metal nitrides, the high melting point metals and the alloys of the high melting point metals are inactive to electroless plating reaction, it has been impossible to perform electroless plating directly on the metal nitride, the high melting point metal or the alloy.

Further, since the metal nitrides, the high melting point metals and the alloys of high melting point metals have a large electric resistivity, it has been impossible to perform electrolytic plating directly on a metal nitride, a high melting point metal or an alloy.

Therefore, in order to fill very small depressed portions with plating, it is necessary to form a seed layer to serve as a catalyst through electroless plating of copper, palladium or the like. A seed layer formed through a dry metallizing method is poor in providing uniform deposition onto the bottom portion and the side wall of a very small trench, which is an obstacle to making the wiring finer.

Accordingly, in regard to a method of forming the seed layer, a method which is excellent in uniform deposition capability for replacing the dry metallizing method is needed. Although there is a study concerning a substitution plating method using palladium for forming a seed layer, this method has a problem in the formation of finer wiring because palladium increases the resistivity of the wiring, as described above.

Although there is a study concerning a substitution plating method using copper, this method has a problem of poor adherence. Further, these substitution plating methods have a fatal problem in that sufficient reliability can not be secured because elution of the barrier layer occurs as the plating metal is deposited.

SUMMARY OF THE INVENTION

An object of the present invention is to provide a semiconductor device in which very small depressed portions of via-holes or trenches on a substrate are directly filled with a metal, without forming any seed layer of high resistivity, by using a dry metallizing method, and to provide a module and a large-scaled computer employing the semiconductor devices.

Another object of the present invention is to provide a method of manufacturing a semiconductor device, which method is excellent in effecting uniform deposition in very small depressed portions of via-holes or trenches on a substrate and in filling the via-holes or the trenches with a metal without elution of a barrier layer during the progress of the plating reaction.

In accordance with the present invention, after treating an electric conductor surface of a barrier layer made of an inorganic compound or a high melting point metal and covering a surface of a dielectric layer on an LSI semiconductor substrate with a treating solution containing a complex forming agent, the electric conductor is electrically connected with a substance in which electroless plating reaction is carried out or a substance in which electroless plating reaction is carried out, and thereby the plating metal is formed on the electric conductor surface by applying electroless plating. All of the via-holes or trenches formed in the insulator layer are filled with the plating metal.

The present invention is characterized by a semiconductor device comprising an insulator layer having a hole and/or a trench for forming a via-stud and/or a wire therein on a semiconductor substrate, preferably on an LSI semiconductor substrate, wherein the via-stud and/or the wire are formed in the via-hole and/or the trench through a barrier layer made of an inorganic compound or a high melting point metal formed on an inner surface of the via-hole and/or the trench, the via-stud and/or the wire being formed of the same metal as a metal composing the barrier layer.

Further, the present invention is characterized by a semiconductor device comprising insulator layers with at least one via-stud and insulator layers with wiring disposed on a semiconductor substrate, preferably on an LSI semiconductor substrate, the insulator layers having a via-stud and the insulator layers having wiring being alternately arranged on the substrate. Therein, the whole via-stud in accordance with the present invention is formed of the same metal as a metal composing a barrier layer and is formed through electroplating after electroless plating or through electroless plating.

The present invention is characterized by a resin sealed semiconductor device of the surface mounting type or the non-surface mounting type which is sealed by a composition containing epoxy resin, spherical quartz particles and silicone polymer, or not containing silicone polymer. The content of the spherical quartz particles is more than 70 weight %, preferably 80 to 95 weight %, of the total weight of the composition. In accordance with the present invention, the composition used for a low-profile semiconductor device having a thickness thinner than 1.5 mm, such as a logic or memory semiconductor device, contains quartz particles of 82 to 90 weight % but does not contain a silicone polymer, and more than 90%, of the quartz particles are spherical quartz particles and 3 to 10% of the quartz particles are non-spherical (cubic) quartz particles.

Further, in accordance with the present invention, a logic or memory semiconductor device having a thickness greater than 1.5 mm, such as a general QPF of a surface mounting type, a DIPL of a non-surface mounting type for the logic device and an SOJ or a TSOP of a surface mounting type, a DIPL of a non-surface mounting type for the memory device is sealed with an epoxy resin composition containing a filler, preferably quartz particles, of 75 to 81% and silicone. It is preferable that the filler is composed of 60 to 80% of melt spherical quartz particles having grain size of 5 $\mu$m to 100 $\mu$m and the remainder of cubic quartz particles (pulverized quartz particles) having a grain size smaller than 5 $\mu$m, preferably smaller than 3 $\mu$m. It is preferable that the content of the spherical quartz particles is 65 to 75%.

The present invention is characterized by a module comprising a multilayer thin film wiring substrate composed of a plurality of laminated insulator layers, each of the insulator layers having a wiring layer on a surface; and a semiconductor device mounted on the wiring substrate, wherein the semiconductor device is the semiconductor device described above.

The present invention is characterized by a large-scaled computer comprising a module substrate mounted on a printed wiring board, the module substrate being connected to the printed wiring board through connecting pins; a multilayer thin film wiring substrate mounted on the module substrate, the multilayer thin film wiring substrate having a plurality of laminated insulator layers, each of the insulator layers having a wiring layer; and the above-mentioned semiconductor device mounted on the wiring substrate.

The present invention is characterized by a semiconductor device comprising an insulator layer having a via-stud on a semiconductor substrate, wherein the via-stud is formed in a via-hole through a barrier layer made of an inorganic compound or a high melting point metal formed on an inner surface of the via-hole, the diameter of the via-stud being smaller than 0.3 $\mu$m.

The present invention is characterized by a semiconductor substrate plating method of forming a plating metal on a surface of a conductor layer of a semiconductor substrate using an electroless plating solution, the semiconductor substrate comprising an insulator layer made of a dielectric having a trench or a via-hole formed on the semiconductor substrate; and a conductor layer of a barrier layer made of an inorganic compound or a high melting point metal covering the surface of the insulator layer including the side surfaces and the bottom surface of the trench or the via-hole, the method comprising the steps of treating the surface of the conductor layer with a treating solution containing a complex forming agent in the electroless plating solution; then electrically connecting the surface of the conductor layer to a substance for carrying out an electroless plating reaction or a substance for which an electroless plating reaction is to be carried out; and performing electroless plating onto the surface of the conductive layer to fill the trench or the via-hole with the metal and to further deposit the metal on the trench or the via-hole filled with the metal.

Further, the present invention is characterized by a semiconductor substrate plating method in which after performing electroless plating onto the surface of the conductive layer, the trench or the via-hole is filled with the metal and the metal is deposited on the trench or the via-hole filled with the metal through electroplating, similar to the above.

It is preferable that the electroless plating described above is copper plating, and the thickness of the plated layer is 1 to 100 nm.

The inorganic compound or the high melting point metal described above is a conductor, and it is preferable that the conductor is any one kind of titanium, tantalum, tungsten, cobalt, and nitrides of these metals, and alloys of titanium, tantalum, tungsten or cobalt. Particularly titanium, tantalum, tungsten or cobalt corresponds to the latter and has a melting point above 1490° C.

It is preferable when the complex forming agent is ethylene-diamine-tetra-acetate, and the electroless plating is electroless copper plating, and the treating solution before performing the electroless copper plating is an aqueous solution which contains at least the above-described ethylene-diamine-tetra-acetate of 0.001 to 1 mol/l and hydrogen peroxide of 0 to 1 mol/l.

It is preferable when the substance electrically connected to the conductor layer is the same metal as a plating metal deposited by the electroless plating.

That is, the conductor layer is formed of a substance on which the plating metal cannot be formed by electroless plating, as described previously. However, the present invention makes it possible to form the plating metal on the conductor layer by treating the substrate with a treating solution containing a complex forming agent, immersing the metallic member made of the plating metal formed by the electroless plating, and electrically connecting the metallic member to the conductor layer.

DESCRIPTION OF THE PREFERRED EMBODIMENTS

There are various combinations of a barrier layer and electroless plating to which the present invention can be applied, as described above. However, the description will be directed to a case where titanium nitride is used for the barrier layer, and electroless copper plating is used for forming the seed layer.

An insulator material of a dielectric layer is formed on a silicon substrate, and after forming trenches in the insulator layer, a barrier layer made of a dielectric of titanium nitride is formed thereon. The sputtering method or the CVD method is used for forming the barrier layer. The CVD method is advantageous from the viewpoint of uniform deposition in the trench. However, in contrast to a seed layer, the barrier layer does not need to have a uniform film thickness between the surface and the inside of the trench, but what is needed is at least to secure a thickness capable of exerting the barrier function. Therefore, the sputtering method can be also employed.

After that, the seed layer is formed on the barrier layer surface. It is preferable when the seed layer has a uniform film thickness both on the surface and inside the trench. The reason for this is that if the seed layer is not formed to a uniform film thickness both on the surface and inside the trench, the resistance of the seed layer becomes different between the surface and the inside of trench when electroplating for filling the trench is performed. Therefore, since the resistance of the seed layer inside the trench having a thinner film thickness becomes higher than the resistance of the seed layer on the surface having a thicker film thickness, it is difficult to apply the electric field to the inside of trench, and, accordingly, the trench can not be filled with the plating metal.

With the conventional sputtering method, it is impossible to form a seed layer having a uniform film thickness both on the surface and inside the trench. In the conventional method not employing the present invention, any difference in the resistances between the surface and the inside of trench is apparently made small by increasing the sputtered film thickness. However, when the sputtered film thickness is increased to a point where it is too thick, an opening portion of the trench or the hole is blocked to form a void.

The present invention is a revolutionary new method of forming a seed layer which can form a uniform thickness film even on a complex shaped surface through electroless copper plating. The reaction of the electrolytic copper plating can be expressed by the following chemical reaction formula (Chemical formula 1).

$$Cu^{2+}(L)+2HCHO+2OH^- \rightarrow Cu+2HCOO^-2H_2O \text{(Chemical formula 1)}$$

There, L is a complex forming agent for forming copper and a complex, and ethylene-diamine-tetra-acetate (hereinafter referred to as EDTA) is often used for the complex forming agent.

This reaction selectively progresses on a metal such as copper, palladium or the like. This is because the metal exerts catalytic activity to oxidation reaction of formaldehyde. Formaldehyde releases an electron when it is oxidized, and a copper ion receives the electron so as to be reduced to metallic copper.

However, titanium nitride of the barrier layer is inactive to the electroless copper plating reaction. Therefore, even if the silicon substrate having a titanium nitride layer formed on the surface is immersed into an electroless copper plating solution, plating reaction is not progressed, and, consequently, copper is not deposited on the barrier surface.

The inventors of the present invention found that electroless copper plating could be performed directly on a titanium nitride surface formed on a surface of a substrate by treating the titanium nitride surface with a surface treating solution containing EDTA, then electrically connecting the barrier layer of the substrate with a copper plate and immersing the substrate into an electroless copper plating solution together with the copper plate.

Therein, it is preferable that after the surface treatment with the EDTA solution, the substrate is directly immersed into the electroless copper plating solution without first carrying out a water washing process. Further, it is preferable when the electrically connected copper plate has a surface area larger than that the wafer of substrate to be plated, and it is better when the surface area of the copper plate is more than 1.5 times as large as that of the substrate.

As described above, the seed layer can be formed on the surface of the barrier layer directly through electroless plating by treating the barrier layer surface to become the base of the electroless plating with the surface treating solution containing the complex forming agent which forms a plating metal and a complex of the electroless plating solution in the next process, then electrically connecting the barrier layer of the substrate to be plated to a substance progressing plating reaction, and immersing them into the electroless plating solution. The film thickness distribution of the seed layer formed by the electroless plating is within±5% in both the surface portion and the inside portion of the trench, and accordingly the uniformity of the film thickness is very good.

In addition to the above-mentioned electroless copper plating, electroless nickel plating, electroless gold plating, and electroless cobalt plating can be also employed for forming a seed layer for forming substrate wiring.

In regard to the insulator layer in accordance with the present invention, a film formed, for example, through a thermal CVD method and made of a Si-containing compound such as $SiO_2$, BPSG, PSG, BSG, AsSG, NSG, SOG, LTO, SiN, SiON, SiOF or the like, an organic group low dielectric film made of amorphous Teflon(poly-tetra-fluoro-ethylene), BCB (benzo-cyclo-butane), parylene, flare (fluorinated-arylene-ether) or the like, or a laminated film of these films is usable.

The method of forming the insulator layer will be described below in detail.

(1) "Condition of forming $SiO_2$ film through thermal CVD"
Gas: $SiH_4/O_2/N_2$=250/250/100 sccm
Pressure: 13.3 Pa
Substrate heating temperature: 420° C.

(2) "Condition of forming SiN film through plasma CVD"
Gas: $SiH_4/N_2O$=50/10 sccm
Pressure: 330 Pa
RF: power 190 W
Substrate heating temperature: 400° C.

(3) "Condition of forming TEOS-$SiO_2$ film through plasma CVD"
Gas: TEOS=50 sccm
Pressure: 330 Pa
RF: power 190 W
Substrate heating temperature: 400° C.

(4) "Condition of forming SiON film through ECR plasma CVD"
Gas: $SiH_4/N_2O$=50/25 sccm
Pressure: 330 Pa
RF: power 800 W
Substrate heating temperature: 360° C.

(5) "Condition of forming $SiO_2$ film through magnetron spattering"
Gas: Ar=100 sccm
Pressure: 0.4 Pa
RF: power 5 kW
Substrate heating temperature: 150° C.

In regard to the technology for forming a via-hole to became a contact hole, a lithography technology and an etching technology are used. A contact hole having a hole diameter smaller than 0.3 μm, preferably 0.15 to 0.25 μm, can be formed in the insulator layer preferably under the following condition.
Gas: $C_4F_8$/CO/Ar=10/100/200 sccm
Pressure: 6 Pa
RF: power 1600 W
Substrate heating temperature: 20° C.

Preferable condition of chemical-mechanical polishing (CMP) of copper is as follows.
"CMP condition of Cu (+Tin/T)"
Polishing pressure: 100 g/cm²
Number of rotations: Surface plate 30 rpm
Polishing head: 30 rpm
Polishing pad: IC-1000 (a trademark)
Sultry: $H_2O_2$ base (containing alumina)
Flow rate: 100 cc/min
Temperature: 25 to 30° C.

EMBODIMENT 1

Figure 1:
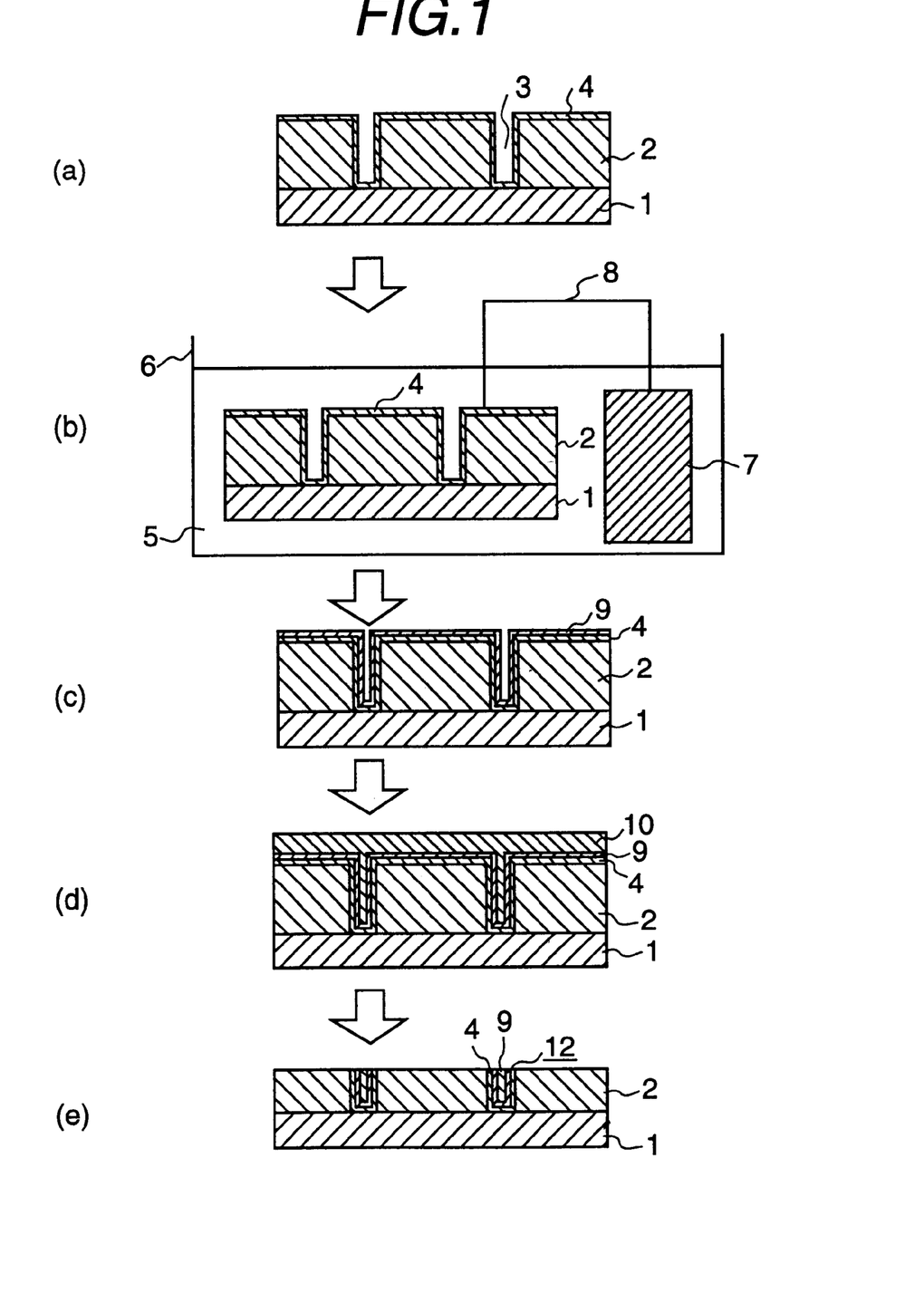
FIG. 1 is a process flow diagram showing in successive schematic cross-sectional views respective processes of a method of plating a substrate in accordance with the present invention.

FIG. 1 is a process flow diagram showing a method of plating an LSI silicon substrate in accordance with the present invention. Initially, as shown in FIG. 1 in process (a), an insulator film 2 was formed by depositing $SiO_2$ to 0.9 μm thickness on an LSI silicon substrate 1 through the thermal CVD method, and via-holes 3 reaching down to the LSI silicon substrate 1 were formed in the insulator film 2. The diameter of each via-hole 3 was 0.3 μm. After that, titanium nitride 4 was deposited to form a barrier layer which covered the whole surface from the via-hole 3 to the surface of the insulator film. In general, an ordinary method of electroless plating can not directly form a plating metal on the surface of a titanium nitride layer.

Next, the substrate was immersed into an aqueous solution containing EDTA of 0.1 mol/l and hydrogen peroxide of 0.08 mol/l at temperature of 65° C. for 2 minutes to perform surface treatment.

Then, as shown in FIG. 1 in process (b), the substrate was immersed into an electroless copper plating solution 5 to be described below without water washing. At that time, the titanium nitride layer 4 on the silicon substrate surface was connected with a copper plate 7 by a conductive wire 8. The plating metal was formed on the surface of the copper plate 7 by electroless plating. Therein, the surface area of the titanium nitride layer 4 on the silicon substrate surface was approximately 30 cm$^2$ and the surface area of the copper plate 7 on both the obverse and the reverse sides was approximately 50 cm$^2$. By performing the electroless copper plating for approximately 2 minutes, a copper thin film 9 was uniformly formed as a seed layer on the surface of the titanium nitride layer 4, and the thickness of the copper thin film 9 was approximately 70 nm both inside of the via-hole 3 and on the surface, as shown in FIG. 1 in process (c).

Electroless Copper Plating Solution

Copper sulfide . . . 0.04 mol/l
Ethylene-diamin-4-acetate-2-sodium . . . 0.03 mol/l
Formaldehyde . . . 0.1 mol/l
2,2'-bipyridyl . . . 0.0002 mol/l
Polyethylene glycol (average molecular weight 600) . . . 0.03 mol/l
pH=12.8
Solution temperature 70° C.

Next, the substrate having the formed copper thin film 9 was extracted out of the electroless copper plating solution 5 and washed with water. Then, the substrate was treated with an aqueous solution of 10% dilute sulfuric acid for 2 minutes, and immersed into an electro-plating solution to perform plating. FIG. 1 in process (d) is a cross-sectional view showing the substrate in which the via-hole 3 is filled with a copper conductor 10 and a copper thin film is formed above the insulator film 2 by electro-plating using a solution described below.

Copper Electroplating Solution

Copper sulfate . . . 0.3 mol/l
Sulfuric acid . . . 1.9 mol/l
Solution temperature . . . 25° C.

Successively, chemical-mechanical (CMP) polishing was performed to separate the conductor 10. FIG. 1 in process (e) is a cross-sectional view showing the substrate after forming via-studs 12 by CMP polishing.

As described above, the effect of the present invention can be confirmed by the fact that the seed layer can be formed by using the plating method in accordance with the present invention without using a dry method, such as the sputtering method, and a small hole can be easily filled with copper by electroplating.

EMBODIMENT 2

Figure 2:
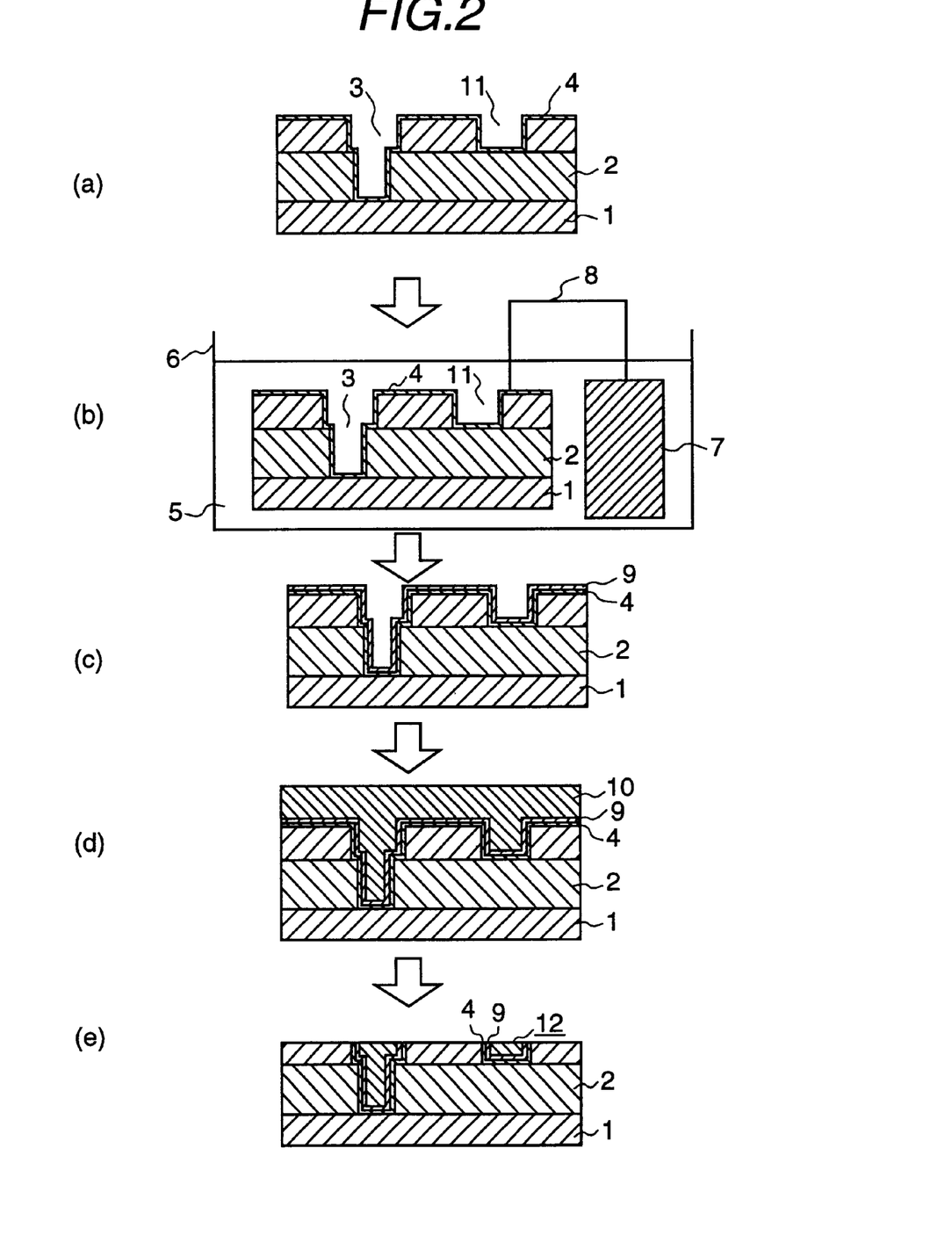
FIG. 2 is a process flow diagram showing in successive schematic cross-sectional views respective processes of a method of plating a substrate in accordance with the present invention.

FIG. 2 is a process flow diagram showing an example in which the present invention is applied to plating for filling a hole for connecting between layers and a trench for forming wiring.

Initially, as shown in FIG. 2 in process (a), an insulator film 2 of SiO$_2$ was deposited on an LSI silicon substrate 1, and a via-hole 3 reaching down to the LSI silicon substrate 1 and a trench 11 for forming wiring were formed in the insulator film 2.

After that, titanium nitride 4 was deposited to form a barrier layer which covered the whole surface from the via-hole 3 to the wiring forming trench 11 and the surface of the insulator film.

Next, the substrate was immersed into an aqueous solution containing EDTA of 0.1 mol/l and hydrogen peroxide of 0.08 mol/l at a temperature of 65° C. for 2 minutes to perform surface treatment.

Then, as shown in FIG. 2 in process (b), the substrate was immersed into an electroless copper plating solution 5 to be described below without water washing, similar to Embodiment 1. At that time, the titanium nitride layer 4 on the silicon substrate surface was connected with a copper plate 7 by a conductive wire 8. Therein, the surface area of the titanium nitride layer 4 on the silicon substrate surface was approximately 30 cm$^2$ and the surface area of the copper plate 7 on both the obverse and the reverse sides was approximately 50 cm$^2$.

By performing electroless copper plating for approximately 2 minutes, a copper thin film 9 was uniformly formed as a seed layer on the surface of the titanium nitride layer 4, and the thickness of the copper thin film 9 was approximately 70 nm both inside of the via-hole 3 and on the surface of the wiring forming trench 11, as shown in FIG. 2 in process (c).

Next, the substrate having the formed copper thin film 9 was extracted out of the electroless copper plating solution 5 and washed with water. Then, the substrate was treated with an aqueous solution of 10% dilute sulfuric acid for 2 minutes, and immersed into an electroplating solution to perform plating. FIG. 2 in process provides (d) is a cross-sectional view showing the substrate in which the via-hole 3 is filled with a conductor 10 by electroplating using the same solution as in Embodiment 1.

FIG. 2 in process provides (e) a cross-sectional view showing the substrate after forming the wiring and via-studs 12 by CMP polishing.

As described above, the effect of the present invention can be confirmed by the fact that the seed layer can be formed by using the plating method in accordance with the present invention without using a dry method such as the sputtering method, and a small hole can be easily filled with copper by electroplating.

EMBODIMENT 3

The substrate was prepared through the same method as that of Embodiment 1 except for using any one of tantalum, tantalum nitride, tungsten and tungsten nitride instead of titanium nitride. As a result, a substrate having a cross-sectional structure similar to that of Embodiment 1 was obtained. Accordingly, the effect of the present invention can be confirmed by the fact that a seed layer can be formed by using the plating method in accordance with the present invention without using a dry method such as the sputtering method, and a small hole can be easily filled with copper by electroplating.

EMBODIMENT 4

Figure 3:
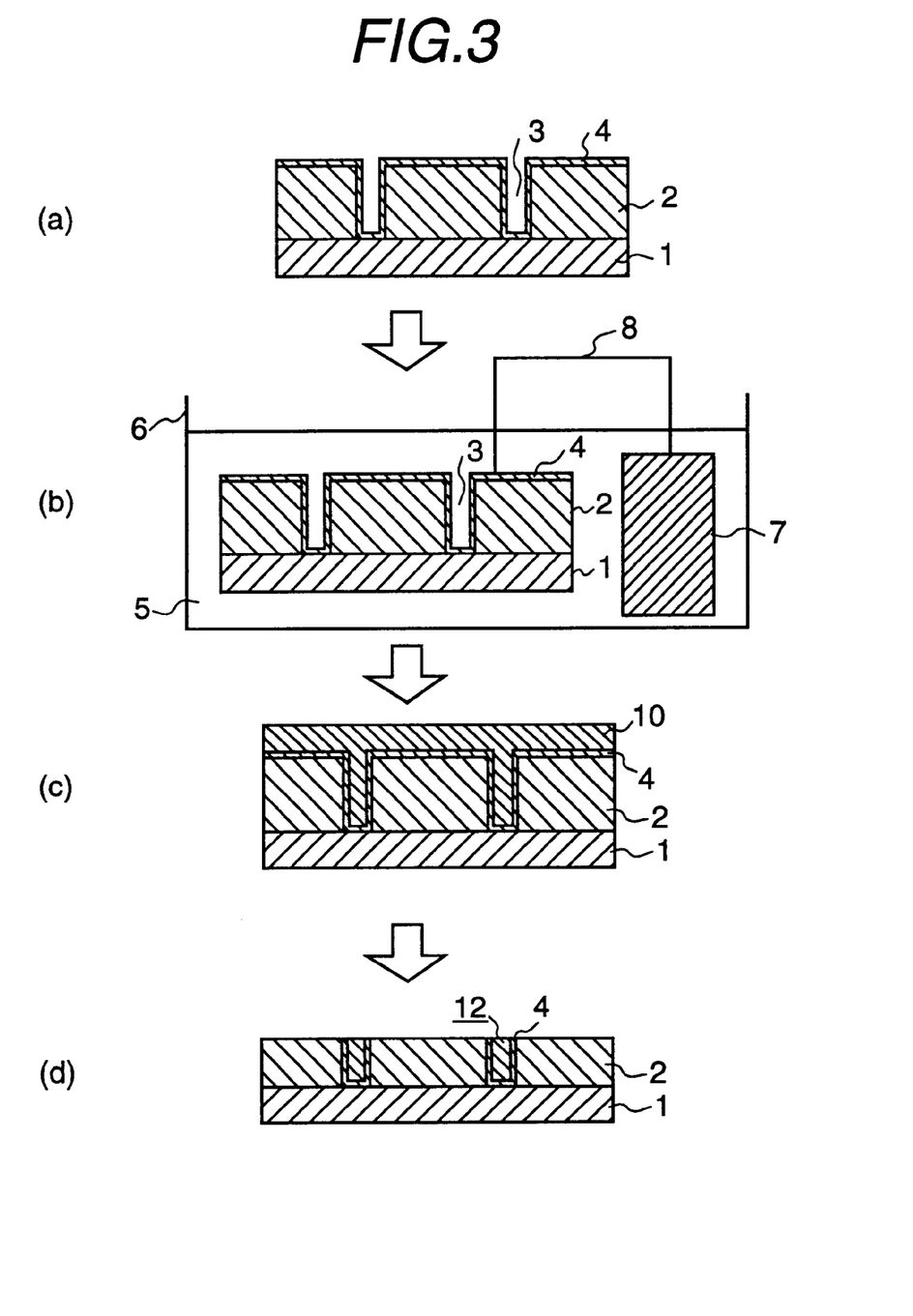
FIG. 3 is a process flow diagram showing in successive schematic cross-sectional views respective processes of a method of plating a substrate in accordance with the present invention.

An outline of the present embodiment is shown in FIG. 3. As shown in FIG. 3 in process (a), an insulator film 2 of SiO$_2$ was formed on an LSI silicon substrate 1 through the same method as in Embodiment 1, and via-holes 3 were formed in the insulator film 2. After that, titanium nitride 4 was deposited to form the barrier layer which covered a whole surface from the via-hole 3 to the surface of the insulator film.

Next, the substrates were respectively immersed into an aqueous solution containing EDTA of 0.1 mol/l and hydrogen peroxide of 0.08 mol/l and into an aqueous solution containing EDTA of 0.1 mol/l without hydrogen peroxide at a temperature of 65° C. for 2 minutes for the former and 30 minutes for the latter to perform surface treatment.

Then, as shown in FIG. 3 in process (b), the substrate was immersed into an electroless copper plating solution 5 without water washing, similar to Embodiment 1. At that time, the titanium nitride layer 4 on the silicon substrate surface was connected with a copper plate 7 by a conductive wire 8. Therein, the surface area of the titanium nitride layer 4 on the silicon substrate surface was approximately 30 cm$^2$ and the surface area of the copper plate 7 on both the obverse and the reverse sides was approximately 50 cm$^2$. By performing electroless copper plating for approximately 30 minutes, an electroless copper plating of approximately 1 μm thickness was formed on the surface of the titanium nitride layer 4.

As a result, the whole via-hole 3 was filled with the copper conductor 10, as shown in FIG. 3 in process (c).

Then, the substrate was subjected to CMP polishing to form the via-studs 12, as shown in FIG. 3 in process (d).

As described above, the effect of the present invention can be confirmed for both treatments by the fact that the seed layer can be formed by using the plating method in accordance with the present invention without using a dry method such as the sputtering method, and a small hole can be easily filled with copper by electroplating.

COMPARATIVE EXAMPLE 1

For the purpose of comparison, an example to which the present invention is not applied will be described below.

A via-hole was formed in a substrate using a method similar to Embodiment 1, and a barrier layer was formed on the substrate using titanium nitride. Then, the substrate was immersed into the electroless plating solution. At that time, surface treatment using the EDTA group treating solution before plating was not performed on the substrate. As a result, electroless plating reaction did not occur on the titanium nitride surface, and accordingly no electroless copper plating film was formed. Therefore, copper was hardly deposited onto the inside of the via-hole by the electroplating with copper in the next process, and the via-hole could not be filled with the metal.

In addition, a substrate was treated in a manner similar to the substrate in Embodiment 1 up to the pre-plating treatment with the EDTA group aqueous solution, and then the substrate was immersed into the electroless plating solution. At that time, the silicon substrate was solely immersed into the electroless copper plating solution without connecting the titanium nitride layer to a copper plate using a conductive wire. As a result, electroless plating reaction did not occur on the titanium nitride surface, and accordingly no electroless copper plating film was formed. Therefore, copper was hardly deposited onto the inside of the via-hole by the electroplating with copper in the next process, and the via-hole could not be filled with the metal.

As described above, it was confirmed that in both of the cases of not applying the present invention, the object of the present invention could not be attained. From this fact, the effectiveness of the present invention can be verfied.

EMBODIMENT 5

Figure 4:
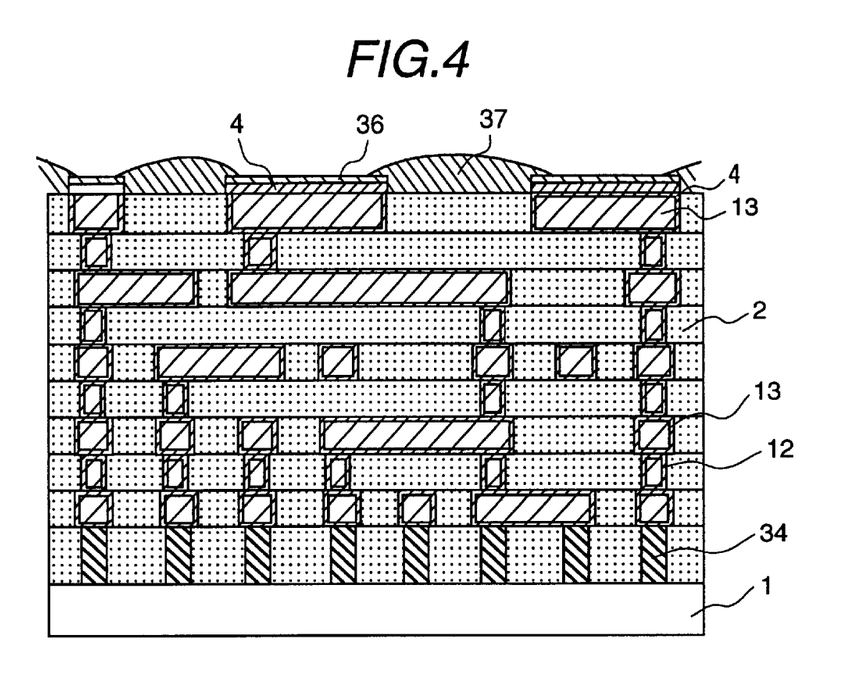
FIG. 4 is a cross-sectional view showing a semiconductor device in accordance with the present invention in which a multilayered wiring layer is formed.

FIG. 4 is a cross-sectional view showing semiconductor device in which a multilayered wiring is formed by forming via-studs 12 of Embodiments 1 to 4 on an LSI silicon substrate 1 and by alternatively forming a wiring layer 13 and an insulator layer 2. As shown in the figure, W plugs 34 are formed in an insulator layer 2 on the LSI silicon substrate 1 and then a wiring layer 13 and an insulator layer 2 with via-studs 12 are formed thereon, that is, the insulating layer 2 with via-studs 12 and the wiring layers 13 are alternatively formed. A titanium nitride layer 4 formed by sputtering and an Al—Si alloy layer 36 formed thereon are formed on the wiring layer 13 formed uppermost. A protective film 37 made of polyimide resin is formed on the surface of the uppermost SiO$_2$ insulator layer 2. The W plug 34 is formed through CVD processing. In the present embodiment, there are five wiring layers 13.

EMBODIMENT 6

Figure 5:
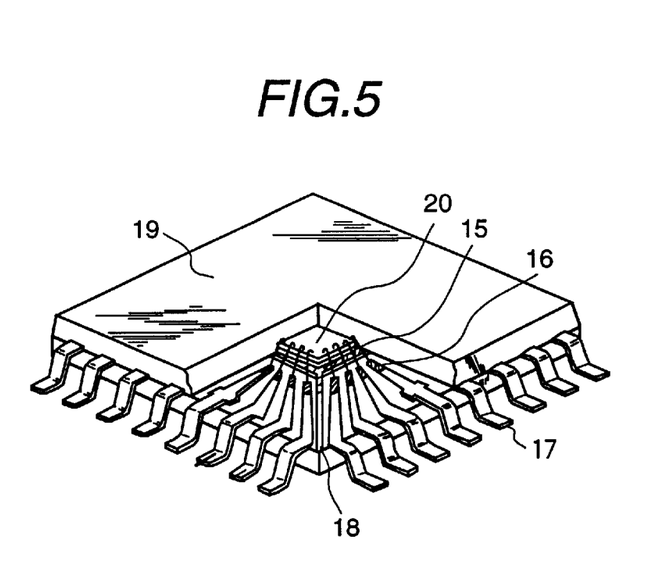
FIG. 5 is a perspective view showing a resin sealing semiconductor device of the surface mounting type in accordance with the present invention.

FIG. 5 is a perspective view showing a semiconductor device of the surface mounting type in which a semiconductor device 20 having a multilayer wiring formed on an LSI silicon substrate as obtained in Embodiment 5 is resin sealed by epoxy resin. The epoxy resin 19 is a resin having a filler to be described below. The reference character 15 indicates an Au wire, the reference character 16 indicates a dye bonding, the reference character 17 indicates an outer lead, and the reference character 18 indicates a support. Copper or 4-2 alloy is used for a lead frame.

Various kinds of fillers shown in Table 1 and the composition of an epoxy resin were kneaded using a two-shaft roll heated at 80° C. for 10 minutes. The resulting composition using a spherical filler is very low in melt viscosity and large in fluidity compared to a composition using a cubic filler, though the gelling times are almost equal to each other. Further, the melt viscosity becomes lower and the fluidity becomes larger as the composition is mixed with a filler having a smaller value of gradient n expressed by an RRS particle size diagram. The filler having a value n below 0.6 is unfavorable because the melt viscosity (180° C.) is slightly increased.

TABLE 1

| | (composition: weight part) No. | | | | |
|---|---|---|---|---|---|
| | 1 | 2 | 3 | 4 | 5 |
| o-cresol novolak type epoxy resin | 90 | 90 | 90 | 90 | 90 |
| phenol bromide novolak type epoxy resin | 10 | 10 | 10 | 10 | 10 |
| phenol novolak type epoxy resin | 52 | 52 | 52 | 52 | 52 |
| tri-phenyl-phosphine | 1 | 1 | 1 | 1 | 1 |
| antimony tri-oxide | 4 | 4 | 4 | 4 | 4 |
| epoxy-silne | 2 | 2 | 2 | 2 | 2 |
| Hoechst wax | 1 | 1 | 1 | 1 | 1 |
| carbon black | 1 | 1 | 1 | 1 | 1 |
| epoxy-denaturated-dimethyl siloxane (denaturating agent) | 10 | 10 | 10 | 10 | 10 |
| filler (sphere-1) n = 0.95 | 643 | — | — | — | — |
| filler (sphere-2) n = 0.65 | — | 643 | — | — | — |
| filler (sphere-3) n = 25 | — | — | 643 | — | — |

TABLE 1-continued

| | (composition: weight part) No. | | | | |
|---|---|---|---|---|---|
| | 1 | 2 | 3 | 4 | 5 |
| filler (cubic-1) n = 1.5 | — | — | — | 643 | — |
| filler (cubic-2) n = 0.75 | — | — | — | — | 643 |
| minimum melt viscosity (poise) | 220 | 280 | 300 | 3310 | 2630 |
| spiral flow (inch) | 34 | 27 | 17 | 2 | 9 |

Furthermore, resin compositions were fabricated using the spherical filler (spher-1) by varying the adding amount to 70, 75, 80 and 85 weight %, respectively.

These compositions were transfer-molded and hardened for 6 hours at 180° C., and then the coefficients of linear expansion, the bending coefficients of elasticity and the thermal stresses at room temperature were measured.

Further, semiconductor elements having a zigzag wiring formed of aluminum on the surface were sealed with a transfer press, and cooling-and heating cycle tests of 2000-cycle between −55° C. for 30 minutes and +150° C. for 30 minutes were conducted using the sealed semiconductor elements to evaluate anti-crack resistance of the sealing resin layer, and the connection reliability of lead-to-gold wire bonding and aluminum wiring (it was judged to be defective when the resistance was changed above 50%

It can be under stood from Table 2 that the compositions containing silicone polymer and having a filler above 80 weight % have small coefficients of linear expansion below $1.3 \times 10^{-5}/°$ C. and small increases in coefficients of elasticity, and accordingly, the thermal stress caused by insertion is small.

The resin sealing type semiconductor device using the resin composition in accordance with the present embodiment is excellent in anti-crack resistance and in connection reliability even if thermal shock such as that of the cooling-and-heating test is applied to the semiconductor device.

In the present embodiment, the resin composition not containing siloxane was added with a filler of a total 85 weight % which consisted of 95% of spherical quartz powder having a grain size smaller than 100 μm and the remainder of cubic quartz powder having a grain size smaller than 10 μm. The resin composition containing siloxane was added with the filler of total 80.5 weight % which consisted of 70% of spherical quartz powder having a grain size smaller than 100 μm and the remainder of cubic quartz powder having a grain size smaller than 5 μm. All of the resin sealing type semiconductor devices had characteristics similar to that of the embodiment described previously.

TABLE 2

| | (composition: weight part) No. | | | | |
|---|---|---|---|---|---|
| | 6 | 7 | 8 | 9 | 10 |
| o-cresol novolak type epoxy resin | 90 | 90 | 90 | 90 | 90 |
| phenol bromide novolak type epoxy resin | 10 | 10 | 10 | 10 | 10 |
| epoxy-denaturated-dimethyl-siloxane (denaturating agent) | 10 | 10 | 10 | 10 | 0 |

TABLE 2-continued

| | (composition: weight part) No. | | | | |
|---|---|---|---|---|---|
| | 6 | 7 | 8 | 9 | 10 |
| adding amount of filler (weight %) | 80 | 85 | 70 | 75 | 80 |
| coefficient of linear expansion ($\times 10^{-5}/°$ C.) | 1.3 | 1.1 | 2.0 | 1.8 | 1.3 |
| coefficient of bending elasticity (kg/mm$^2$) | 2060 | 2170 | 1720 | 1790 | 2320 |
| thermal stress (kg/mm$^2$) | 0.2 | ≈0 | 0.8 | 0.6 | 0.4 |
| anti-crack resistance | 0/45 | 0/45 | 30/45 | 25/45 | 2/45 |
| connection reliability | 0/150 | 0/150 | 70/150 | 45/150 | 5/150 |

The RRS particle size diagram is a particle size diagram expressing particle size distribution according to the Rosin-Rammler formula (Powder Technology Handbook, pages 51–53, distributed by Japan Powder Industrial Association).

$$R(Dp)=100 \exp(-b \cdot Dp^n) \tag{1}$$

There, R(Dp) is the cumulative weight percentage up to a particle size Dp from the maximum particle size, Dp is a particle size, and b and n are constants.

The gradient in the RRS particle size diagram corresponds to the value n in the Rosin-Rammler formula which is expressed by a straight line connecting two points where the cumulative weight percentages from the maximum particle size of the RRS particle size diagram become 25% and 75%.

It is known that a particle size distribution of pulverized raw material of the filler agrees with the Rosin-Rammler formula, and becomes a nearly straight line in the RRS particle size diagram expressing the particle size distribution based on the formula.

The inventors of the present invention have confirmed by measuring particle size distributions of various kinds of fillers that all the particle size distributions of the fillers almost show linearity in the RRS particle size diagram above 90 weight percentage and well agree with the above formula if the powder is not specially sieved.

The preferable melted quartz powder used in accordance with the present invention is composed of spherical particles which are formed by supplying melt quartz powder pre-pulverized in a predetermined particle size distribution by a constant amount into a high temperature flame generated from a melting apparatus using a flammable gas such as propane, butane, acetylene, hydrogen or the like as the fuel to melt the pulverized powder and then cooling. Since the above-mentioned melt quartz itself is small in coefficient of linear expansion and very small in ionic impurities, it is suitable for use as a resin composition material for sealing a semiconductor element.

It is preferable when the amount of the particles having a particle size within a range of 0.5 to 100 am is 90 weight % or more. If the amount of particles having a particle size below 0.5 μm is increased, the thixotropic property of the resin component becomes large so as to increase the viscosity and reduce the fluidity. On the other hand, if the amount of particles having a particle size exceeding 100 μm is increased, the Au wires of the semiconductor element are deformed or broken and a resin filling defect is likely caused by coarse particles blocking the mold when the semiconductor element is sealed.

Further, it is preferable when the gradient n shown in the RRS particle size diagram is set to 0.6 to 0.95. When the value of n is larger than 0.95, the volume of the filler is bulked up and accordingly the viscosity of the resin composition is increased and the fluidity is decreased. Therefore, it is preferable when the value n is as small as possible. On the other hand, in accordance with the present invention, there is the condition that an amount of the particles having particle size within a range of 0.5 to 100 μm is preferably 90 weight % or more. The lower limit value n of 0.6 is the minimum value acceptable under this condition.

The silicone polymer used in accordance with the present invention is poly-dimethyl-syloxane having a functional group such as an amino group, a carboxyl group, an epoxy group, hydroxyl group, pyrimidine group or the like in the end or the side.

Epoxy resin in a solid state at room temperature includes a cresol novolak type epoxy resin, phenol novolak type epoxy resin, bis-phenol A type epoxy resin and so on as a semiconductor sealing material wherein, novolak resins, such as phenol novolak, cresol novolak and so on, acid anhydrides, such as pyromellitic acid anhydride, benzophenone anhydride and so on, are used as the curing agent, and further, a curing accelerating agent, a flexibility-improving agent, a coupling agent, a coloring agent, an anti-flammable agent, a mold detaching agent and so on may be mixed if necessary.

The epoxy resin composition can be molded by kneading the raw materials using a two-shaft roll or an extrusion machine heated to 70 to 100° C., and by molding using a transfer press under conditions of a mold temperature of 160 to 190° C., a molding pressure of 30 to 100 kg/cm$^2$, and a curing time of 1 to 3 minutes.

By making the coefficient of linear expansion of the cured material as small as $1.3 \times 10^{-5}/°$ C., as described previously, the coefficient of elasticity can be also decreased. Therefore, the Au wires of the semiconductor element are hardly deformed or broken when the semiconductor element is sealed, and the thermal stress caused by the difference in the coefficients of linear expansion is small. Therefore, the semiconductor device is excellent in temperature cycle resistance, thermal resistance and humidity resistance.

Since the quartz powder used as the filler is melted to make the powder particles spherical, the bulk is decreased and, accordingly, the filler can be easily filled in high density. Further, since the particle of the filler has no corner which may damage the semiconductor element, it is possible to prevent the characteristic of the semiconductor element from being ill affected. Furthermore, the coefficient of elasticity of the resin composition can be made small and the thermal stress caused by the difference in the coefficients of linear expansion can be made smaller by mixing the silicone polymer.

EMBODIMENT 7

Figure 6:
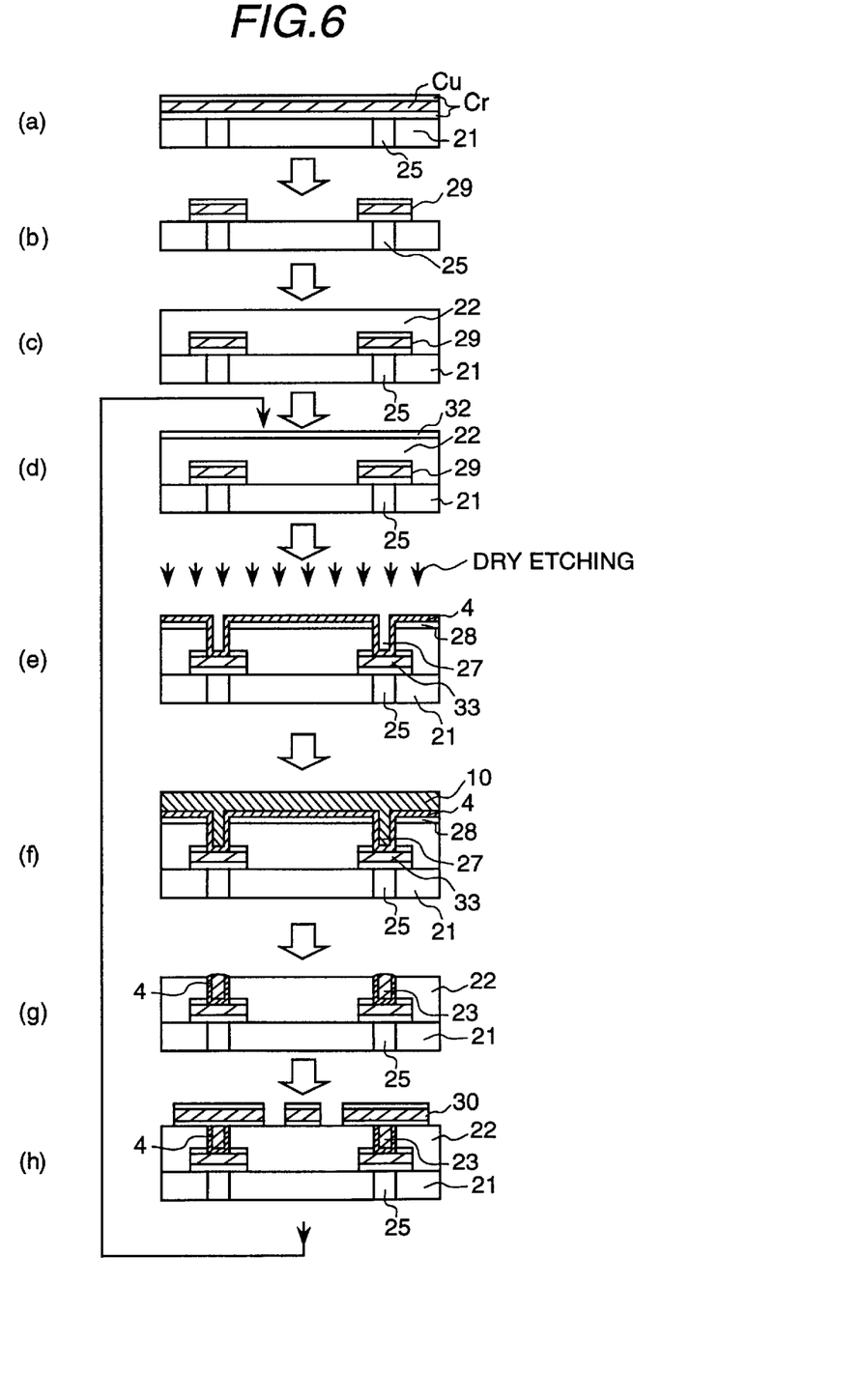
FIG. 6 is a process flow diagram showing the process of manufacturing a thin film multilayer wiring substrate.

FIG. 6 is a process flow diagram showing an example of a manufacturing process of a copper/polyimide thin film multilayer wiring substrate in accordance with the present invention.

Process (a): A conductor film to be used as a first metallic wiring layer composed of Cr/Cu/Cr films (Cr film: 500 Å thickness, Cu film: 5 μm thickness) was formed on a glass ceramic substrate 21 having 6 mm thickness through a sputtering method in an Ar atmosphere. The reference character 25 indicates a though hole for connection.

Process (b): A resist pattern (positive resist) was formed on the above-mentioned Cr/Cu/Cr film, and a first metallic wiring layer 29 was formed through a wet etching method.

Process (c): A polyimide group bonding sheet having 20 μm thickness in a semi-cured state was press bonded as an insulator layer 22 on the first metallic wiring layer 29, and then cured.

Process (d): Next, an Al film 32 having 2000 Å thickness was formed as a dry etching mask through a vacuum vapor deposition method.

Process (e): A dry etching mask 28 for forming a via-hole through a photo-etching method was formed, and then a via-hole 27 was formed using a parallel-plate type dry etching apparatus, not shown, of an oxygen gas plasma of 3 Pa gas pressure, 500 W RF output.

Process (f): A barrier layer 4 made of titanium nitride was formed over the whole surface of the substrate. At that time, both of the polyimide surface and the inner surfaces of the via-hole were covered with the titanium nitride. After that, the substrate was treated in an aqueous solution containing EDTA as a pre-treatment similar to the case of the Embodiment 1, and then the pre-treated substrate was subjected to electroless copper plating through a similar method shown in FIG. 3 at process step (b). As a result, the via-hole was completely filled with copper.

Process (g): Then, a via-stud 23 was formed by performing CMP polishing in the manner similarly to Embodiment 1.

The required time of the electroless copper plating for forming the Cu via-stud of 30 μm diameter and 25 μm height was approximately 5 hours.

Process (h): A second metallic wiring layer 30 was formed by forming a conductor film composed of Cr/Cu/Cr films (Cr film: 500 Å thickness, Cu film: 5 μm thickness) on the above-mentioned insulator layer 22 through the sputtering method and then etching the conductor film, similar to the process (a) and the process (b).

By repeating the processes described above, a thin film multilayer wiring substrate having three or more layers can be manufactured.

EMBODIMENT 8

Figure 7:
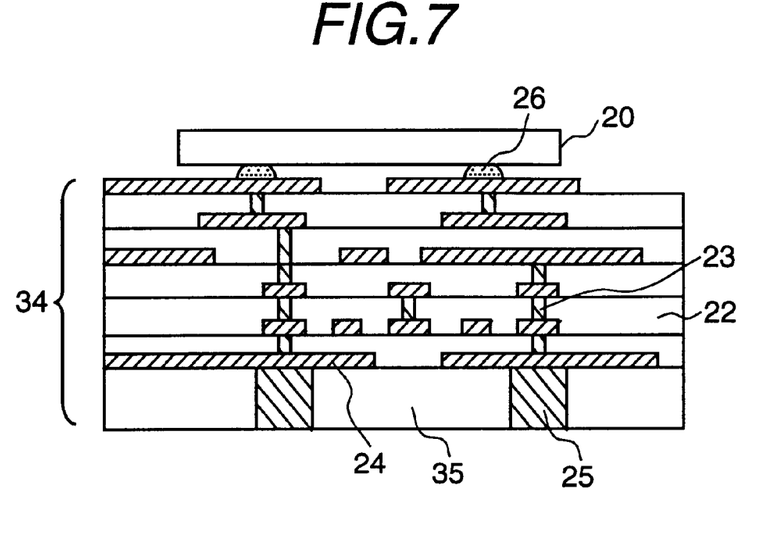
FIG. 7 is a schematic cross-sectional view showing a mounting structure using a thin-film multilayer wiring substrate in accordance with the present invention.

FIG. 7 is a schematic cross-sectional view showing a mounting structure in which an LSI 20, having the multilayer wiring formed in Embodiment 5 on the surface, is mounted on a thin-film multilayer wiring substrate 34 obtained in the present embodiment. A thin film wiring layer made of polyimide and copper was formed on a ceramic substrate 35, and using solder bumps 26, the LSI 20 having the multilayer wiring was mounted on and connected to the thin-film multilayer wiring substrate 34 having a via-stud 23 connection. The wiring layer 24, the via-stud 23 and the insulator layer 22 were manufactured through a method similar to that in Embodiment 7.

EMBODIMENT 9

Figure 8:
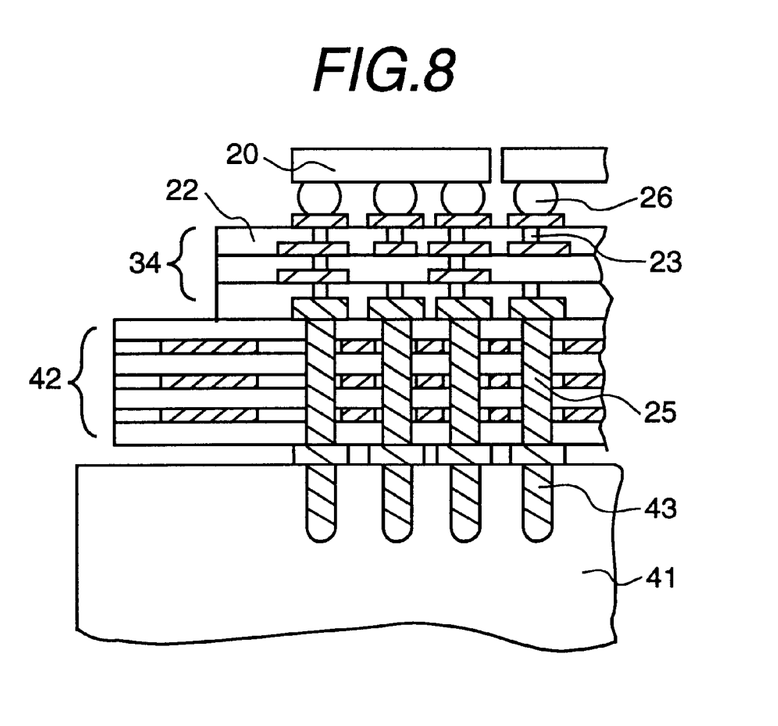
FIG. 8 is a schematic cross-sectional view showing an example of the mounting of a large-scaled computer board in accordance with the present invention.

FIG. 8 is a schematic cross-sectional view showing an example of a mounting in which the thin film multilayer wiring substrate mounting the LSI described above is applied to a large-scaled computer board. In the example, a module substrate 42 of the pin-inserting type is mounted on a large printed wiring board 41.

The module substrate 42 is made of a multilayer sintered body composed of glass ceramic and copper layers, and has connecting pins 43 on the bottom surface. The thin film multilayer substrate 44 in accordance with the present invention is formed on the module substrate 42, and the LSI 20 is connected to and mounted on the thin film multilayer substrate 44 via the solder bumps 26.

According to the mounting substrate of the present embodiment, the number of wires can be reduced to approximately ¼ compared to that in a conventional one, and the wiring density can be increased. Further, the signal transmission speed can be increased to approximately 1.5 times as fast as that in the conventional one.

The thin film multilayer wiring substrate of the present embodiment can attain speed-up of signal transmission by high density mounting and short wiring. Further, by employing the sheet-shaped insulator layer (for example, the polyimide group complex sheet described above), the manufacturing process can be substantially shortened.

EMBODIMENT 10

Figure 9:
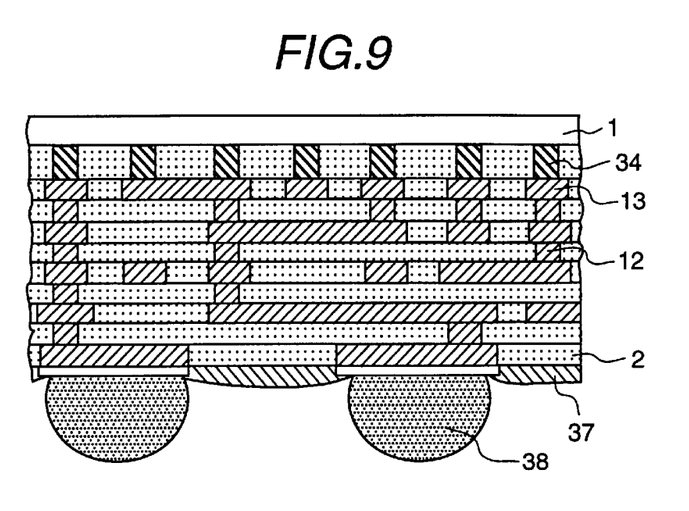
FIG. 9 is a cross-sectional view showing a semiconductor device having a multilayered wiring layer in accordance with the present invention.

FIG. 9 is a cross-sectional view showing a semiconductor device in which solder balls 38 are formed on a multilayered wiring layer of the semiconductor device having the multilayered wiring layer formed in FIG. 4. The solder ball 38 is made of Au.

Figure 10:
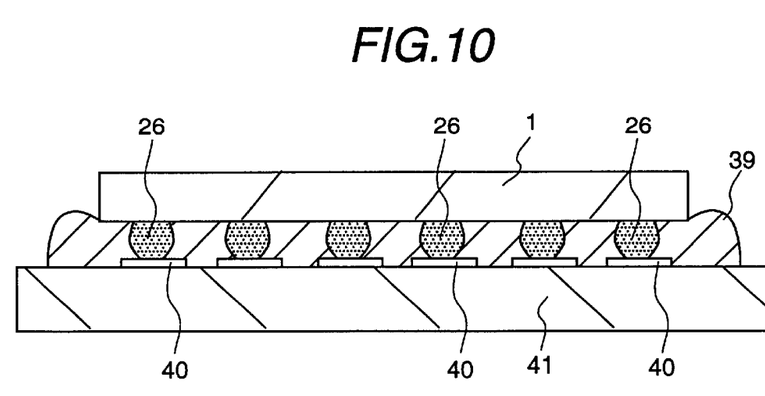
FIG. 10 is a cross-sectional view showing the structure of flip chip mounting in accordance with the present invention.

FIG. 10 is a cross-sectional view showing the structure of a flip chip mounting in which the semiconductor device of FIG. 9 is bonded to a large-scaled printed wiring board 41 by the above-mentioned solder balls 38. The gap between the large-scaled printed wiring board 41 and the semiconductor device is filled with an under filler made of epoxy resin after bonding them with the solder balls 38, as shown in the figure. In the present embodiment, the via-stud 12 having a diameter of 0.3 μm described Embodiments 1 to 4 and the wiring layer 13 are also alternatively formed, as shown in FIG. 9.

EMBODIMENT 11

Figure 11:
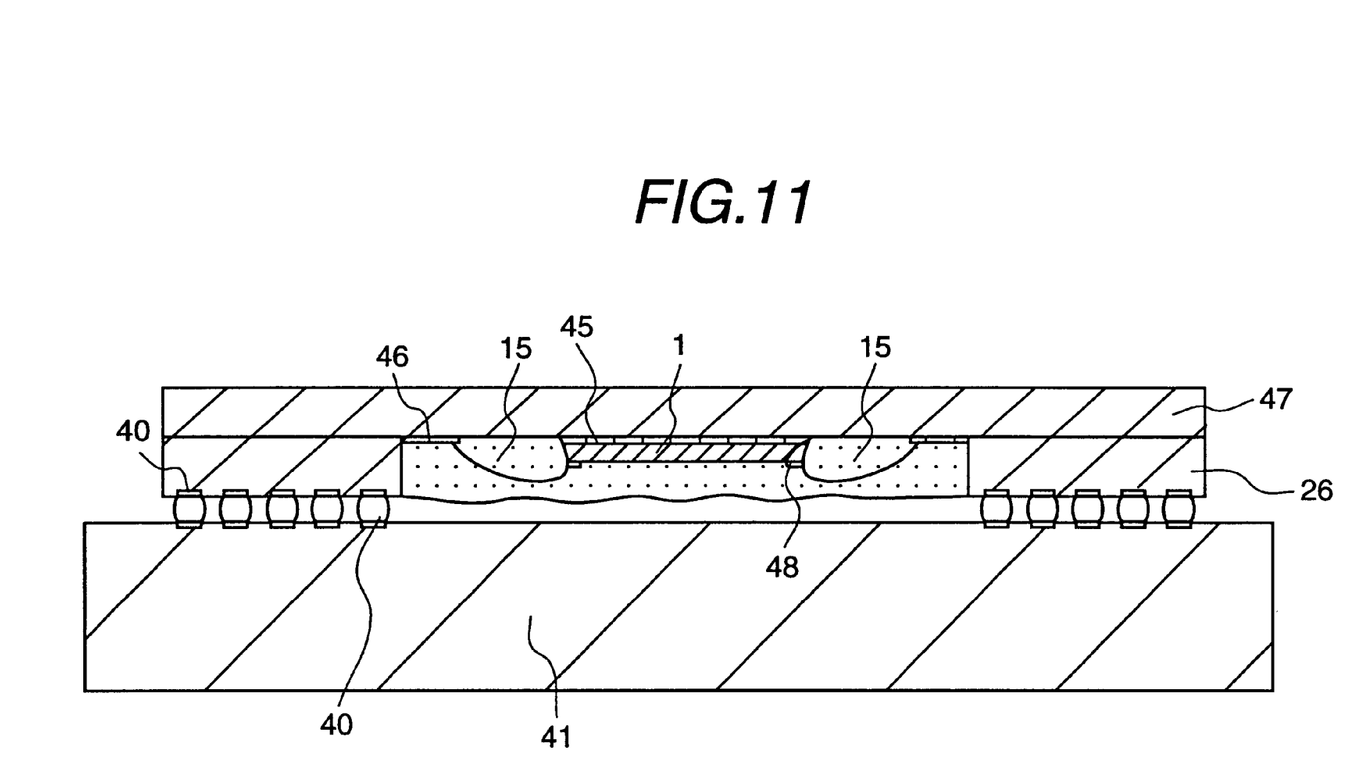
FIG. 11 is a cross-sectional view showing a ball grid array type semiconductor device in accordance with the present invention.

FIG. 11 is a cross-sectional view showing a ball grid array type semiconductor device. The present embodiment also employs the semiconductor device 1 having the multilayered wiring layer obtained in Embodiment 5. The above-mentioned semiconductor device 1 is bonded to a base body 47 made of a ceramic or the like with an adhesive 45 made of a resin or the like and is bonded by an Au wire 15 to an inner lead 46. An electrode 48 is formed by successively forming a titanium nitride layer and an Al—Si alloy layer on a Cu wire, and is pole-bonded on the semiconductor element and wedge-bonded to the inner lead 46. An electrode 40 is formed by plating Sn on the Cu wire.

According to the present invention, since very small depressed portions on a substrate can be directly filled through electroless plating without forming a seed layer through a dry metallizing method such as a conventional sputtering method, high density wiring can be realized.

In addition, a seed layer having an excellent in deposition uniformity with regard to the very small depressed portions on the substrate and without elution of the barrier layer accompanied by progress of plating reaction is formed through electroless plating, and then the very small depressed portions on the substrate having the seed layer formed thereon are filled by electroplating. Therefore, it is possible to form a fine wiring which is stable in quality.

Thereby, it is possible to form high density wiring of stable quality on a substrate, and accordingly to obtain a semiconductor device, a module and a large-scaled computer having high reliability.

The thin film multilayer wiring substrate of the present embodiment is advantageous for use as a substrate for a large-scaled computer, a substrate for a workstation and a substrate for a small-scaled electronic apparatus, such as a video-camera and so on.

What is claimed is:

1. A method of manufacturing a semiconductor device by filling at least one of a via-hole and a trench in an insulator layer having said at least one of the via-hole and the trench on a semiconductor substrate with a conductor through plating, the method comprising the steps of:

forming a barrier layer made of any one of an inorganic compound and a high melting point metal on inner surfaces of said at least one of the via-hole and the trench; then treating said semiconductor substrate with a treating solution containing a complex forming agent;

immersing said semiconductor substrate into an electroless solution for electroless plating a metal, and at the same time bringing a member made of the same metal as the metal formed by said electroless plating in contact with said electroless solution; and electrically connecting said member to said barrier layer, said member being connected to said barrier layer by connecting a wire between said member and said barrier layer for performing said filling through said electroless plating.

2. A method of manufacturing a semiconductor device according to claim 1, wherein said immersing is performed directly after said treating.

3. A method of manufacturing a semiconductor device according to claim 1, wherein said metal is copper.

4. A method of manufacturing a semiconductor device according to claim 1, wherein said plating layer formed through said electroless plating has a thickness of 1 to 100 nm.

5. A method of manufacturing a semiconductor device according to claim 1, wherein the complex forming agent includes ethylene-diamine-tetra-acetate.

6. A method of manufacturing a semiconductor device according to claim 1, wherein the plating layer is formed directly on the barrier layer.

7. A method of manufacturing a semiconductor device according to claim 1, wherein said member has a surface area that is greater than a surface area of the semiconductor substrate.

8. A method of manufacturing a semiconductor device according to claim 1, wherein said member has a surface area more than 1.5 times the surface area of the semiconductor substrate.

9. A method of manufacturing a semiconductor device according to claim 1, wherein said metal is selected from the group consisting of copper, nickel, gold and cobalt.

10. A method of manufacturing a semiconductor device by filling a via-hole in an insulator layer having said via-hole on a semiconductor substrate with a conductor through plating, the method comprising the steps of:

forming a barrier layer made of any one of an inorganic compound and a high melting point metal on an inner surface of said via-hole; then treating said semiconductor substrate with a treating solution containing a complex forming agent;

immersing said semiconductor substrate into an electroless solution for electroless plating a metal, and at the same time bringing a member made of the same metal as the metal formed by said electroless plating in contact with said electroless solution;

electrically connecting said member to said barrier layer and forming a plating layer through said electroless plating, said member being connected to said barrier 1 layer by connecting a wire between said member and said barrier layer; and then performing electroplating so as to provide said filling.

11. A method of manufacturing a semiconductor device according to claim 10, wherein said immersing is performed directly after said treating.

12. A method of manufacturing a semiconductor device according to claim 10, wherein said metal is copper.

13. A method of manufacturing a semiconductor device according to claim 10, wherein said plating layer formed through said electroless plating has a thickness of 1 to 100 nm.

14. A method of manufacturing a semiconductor device according to claim 10, wherein the complex forming agent includes ethylene-diamine-tetra-acetate.

15. A method of manufacturing a semiconductor device according to claim 10, wherein the plating layer is formed directly on the barrier layer.

16. A method of manufacturing a semiconductor device according to claim 10, wherein said member has a surface area that is greater than a surface area of the semiconductor substrate.

17. A method of manufacturing a semiconductor device according to claim 10, wherein said member has a surface area more than 1.5 times the surface area of the semiconductor substrate.

18. A method of manufacturing a semiconductor device according to claim 10, wherein said metal is selected from the group consisting of copper, nickel, gold and cobalt.

* * * * *